(12) United States Patent
Hiemstra et al.

(10) Patent No.: US 11,750,190 B2
(45) Date of Patent: Sep. 5, 2023

(54) ENCODED ON-DIE TERMINATION FOR EFFICIENT MULTIPACKAGE TERMINATION

(71) Applicant: Intel Corporation, Santa Clara, CA (US)

(72) Inventors: Sheldon G. Hiemstra, Vancouver (CA); Veeresh Garag, Rancho Cordova, CA (US)

(73) Assignee: Intel Corporation, Santa Clara, CA (US)

( * ) Notice: Subject to any disclaimer, the term of this patent is extended or adjusted under 35 U.S.C. 154(b) by 138 days.

(21) Appl. No.: 17/120,729

(22) Filed: Dec. 14, 2020

(65) Prior Publication Data

US 2021/0175887 A1  Jun. 10, 2021

(51) Int. Cl.
| | |
|---|---|
| G06F 13/42 | (2006.01) |
| G06F 13/40 | (2006.01) |
| G11C 7/10 | (2006.01) |
| H03K 19/00 | (2006.01) |

(52) U.S. Cl.
CPC ..... *H03K 19/0005* (2013.01); *G06F 13/4086* (2013.01); *G06F 13/4282* (2013.01); *G11C 7/1048* (2013.01)

(58) Field of Classification Search
CPC ........... H03K 19/0005; H03K 19/0175; H03K 19/018557; H03K 19/0826; H03K 19/09429; G06F 13/4086; G06F 13/4282; G11C 7/10; G11C 7/1015; G11C 7/1018; G11C 7/22

See application file for complete search history.

(56) References Cited

U.S. PATENT DOCUMENTS

| | | | |
|---|---|---|---|
| 5,991,850 A | 11/1999 | Ryan | |
| 8,041,865 B2 | 10/2011 | Bruennert et al. | |
| 9,153,296 B2 * | 10/2015 | McCall | G11C 7/1078 |
| 2006/0091900 A1 | 5/2006 | Kang et al. | |
| 2010/0182817 A1 | 7/2010 | Koshizuka | |
| 2011/0205832 A1 * | 8/2011 | Jeon | G11C 7/1057 |
| | | | 326/30 |
| 2016/0028395 A1 * | 1/2016 | Bains | H03K 19/01825 |
| | | | 326/30 |
| 2017/0093400 A1 * | 3/2017 | Bains | G06F 3/0673 |
| 2017/0097790 A1 * | 4/2017 | Doo | G06F 13/1668 |
| 2017/0194962 A1 * | 7/2017 | Bains | G06F 3/0604 |
| 2018/0039588 A1 | 2/2018 | Yun et al. | |
| 2018/0130506 A1 * | 5/2018 | Kang | G11C 7/22 |
| 2018/0322914 A1 | 11/2018 | Wu et al. | |
| 2019/0036531 A1 * | 1/2019 | Bains | G06F 3/0629 |
| 2019/0392886 A1 * | 12/2019 | Cox | G11C 11/4072 |
| 2020/0133669 A1 * | 4/2020 | Qawami | H03K 19/0005 |
| 2021/0175887 A1 * | 6/2021 | Hiemstra | H03K 19/018585 |

OTHER PUBLICATIONS

Extended European Search Report for Patent Application No. 21198644.3, dated Mar. 21, 2022, 9 pages.

\* cited by examiner

*Primary Examiner* — Jason Crawford
(74) *Attorney, Agent, or Firm* — Compass IP Law PC (57) ABSTRACT

On-die termination (ODT) is triggered through a serial signal encoding on an ODT signal line instead of a simple binary enable signal. An ODT circuit applies one of multiple termination impedances based on the ODT signal encoding. An ODT enable signal line receives an ODT enable signal as multiple serial bits to encode the selected termination impedance, to cause the ODT circuit to apply the selected termination impedance.

17 Claims, 7 Drawing Sheets

ENCODED ON-DIE TERMINATION FOR EFFICIENT MULTIPACKAGE TERMINATION

FIELD

Descriptions are generally related to chip-to-chip communication, and more particular descriptions are related to on die termination in a memory system.

BACKGROUND

Die-to-die communication that has high bandwidth and high transition speeds benefits from termination impedance on the communication channel to suppress reflections and reduce noise that could increase error rates or close the data eye of the channel. For example, many memory systems having memory devices or dies that couple to a controller that controls access (e.g., reading and writing) to the memory devices. The controller can be implemented in an application specific integrated circuit (ASIC).

The controller traditionally provides on die termination (ODT) signaling to the memory devices through a pin to enable or disable termination for a specific memory device package, which can include one or more memory dies. An ODT enable signal traditionally controls the on and off timing of ODT, which results in the same termination value for internal resistance termination (RTT) being used for read operations and write operations. The use of other signals can control the value of the of the memory devices, at the cost of increased complexity and increased power usage. ODT termination values can be changed through setting configuration registers on the memory device, which consumes channel bandwidth, which would incur a significant performance penalty to be able to change termination values between read and write operations on the channel.

BRIEF DESCRIPTION OF THE DRAWINGS

The following description includes discussion of figures having illustrations given by way of example of an implementation. The drawings should be understood by way of example, and not by way of limitation. As used herein, references to one or more examples are to be understood as describing a particular feature, structure, or characteristic included in at least one implementation of the invention. Phrases such as "in one example" or "in an alternative example" appearing herein provide examples of implementations of the invention, and do not necessarily all refer to the same implementation. However, they are also not necessarily mutually exclusive.

Descriptions of certain details and implementations follow, including non-limiting descriptions of the figures, which may depict some or all examples, and well as other potential implementations.

DETAILED DESCRIPTION

As described herein, on-die termination (ODT) is triggered through a serial signal encoding on an ODT signal line instead of a simple binary enable signal. An ODT circuit applies one of multiple termination impedances based on the ODT signal encoding. An ODT enable signal line receives an ODT enable signal as multiple serial bits to encode the selected termination impedance, to cause the ODT circuit to apply the selected termination impedance. In one example, the ODT input signal to the media has a legacy mode, where the signal line operates as a binary on/off control signal, as well as an additional mode where the ODT value applied by a terminating media device would be determined based on an encoding received on the ODT input signal. In one example, the application of serial encoding is selectively enabled through configuration setting. In one example, the application of serial encoding of the ODT signal can be made backwards compatible with legacy devices.

Traditional systems that rely on binary ODT signals can only change non-target termination values through writes to configuration registers or media register writes. Writing to configuration registers consumes channel bandwidth. Thus, traditional multipackage implementations are constrained to use a single non-target termination value (e.g., 60-ohm) for both reads and writes. Using the same termination for reads and writes results in non-optimal termination.

Adding encoding to the ODT signal enables unique read and write ODT values on target or non-target packages for configurations that have two or more packages per channel. Applying unique read and write termination values can improve signal integrity margins. The separate read and write termination values can reduce termination power by allowing termination to be independently adjusted during reads and writes to avoid the application of termination that is stronger than required. For example, changing the write termination from 40 ohms or 60 ohms to 80 ohms can have a significant reduction in power.

Figure 1A:
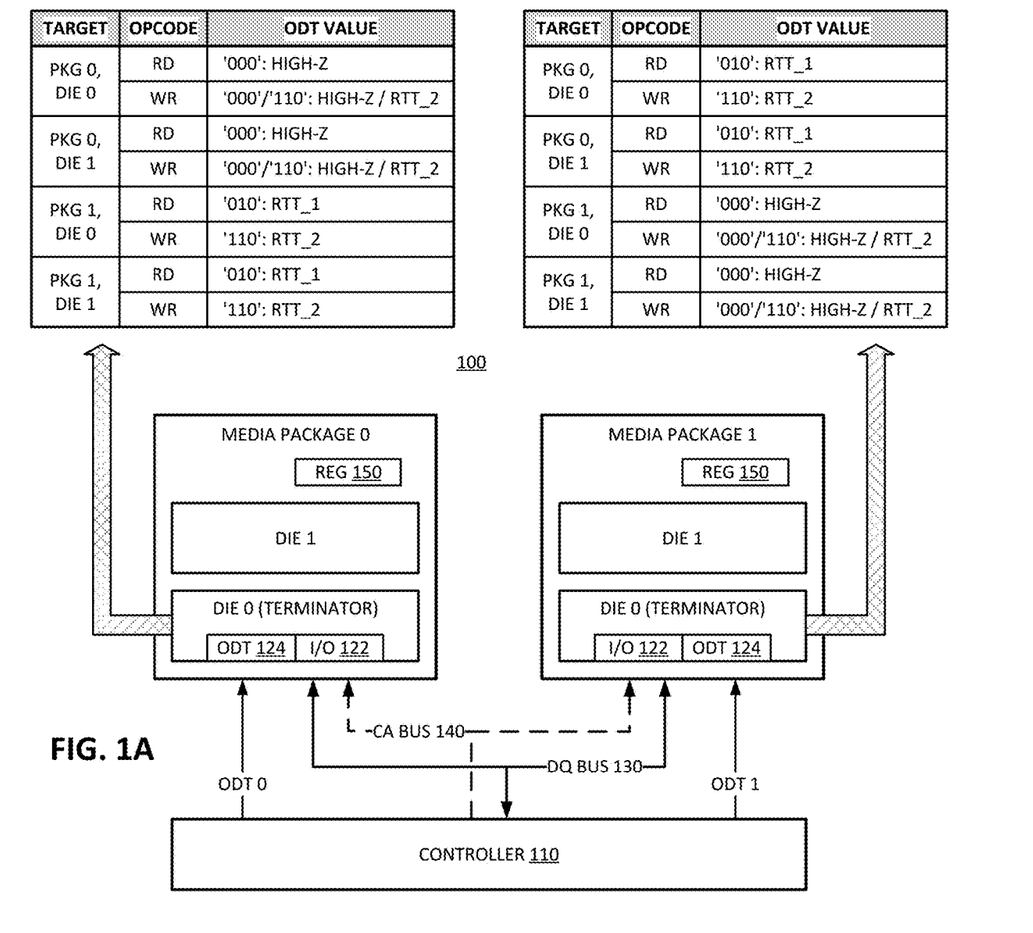
FIG. 1A is a block diagram of an example of a storage device that can apply ODT based on serial encoding.

FIG. 1A is a block diagram of an example of a storage device that can apply ODT based on serial encoding. System 100 includes controller 110 and two memory packages, media package 0 and media package 1. In one example, system 100 represents a solid state drive (SSD). In one example, system 100 represents a dual in-line memory module (DIMM).

In one example, multiple memory devices or dies are included in groups referred to as a package or multidevice package. Media Package 0 and Media Package 1 represent multi-die packages. Media Package 0 and Media Package 1 can connect to controller 110 over one or more buses, which can include multiple signal lines each.

In one example, controller 110 is an ASIC. Controller 110 can be referred to as a media controller, being the control hardware that controls access to the memory dies. In one example, both Media Package 0 and Media Package 1 connect to controller 110 via a single data or DQ channel.

DQ bus 130 represents the data channel. DQ bus 130 can include multiple signal lines (e.g., 4 to 10 or more). CA bus 140 represents a command and address bus to send commands to the media devices to control access and trigger internal operations of the media. It can be observed that DQ bus 130 can be bidirectional bus, whereas CA bus 140 is typically unidirectional. There can be other signal lines (not shown) to allow media package 0 and media package 1 to send feedback signals (e.g., error signals) to controller 110. There can also be other control signal lines from controller 110 to the media packages. System 100 illustrates an ODT signal line; other control signal lines can be included.

Media Package 0 and Media Package 1 include Die 0 and Die 1. The media packages can include more dies. In one example, Media Package 0 and Media Package include 4 dies each (i.e., a quad die package (QDP)). In one example, when system 100 includes multidevice packages, one of the devices is selected as a terminating device or terminator for the group. Die 0 is illustrated as including I/O (input/output) 122 and ODT 124. I/O 122 represents an interface to the one or more buses of the channel connecting the media packages to controller 110. The interface components can include drivers and receivers and other components to enable high speed communication with controller 110. Although I/O 122 and ODT 124 are illustrated specifically with Die 0 and not with Die 1, Die 1 includes the same components. The components are specifically shown with respect to Die 0 for a discussion of the termination of the channel.

In one example, ODT 124 is part of the hardware interface associated with I/O 122. ODT 124 can provide settings for impedance to be applied to the interface to specified signal lines. In one example, ODT 124 applies impedance to the DQ signal lines. In one example, ODT 124 can apply impedance to one or more command signal lines of CA bus 140. In one example, ODT 124 can apply different termination values or ODT values based on a signal received on the ODT signal line. ODT 124 can provide internal resistance termination (RTT) for Die 0 to terminate the signal lines for the entire media package to reduce noise due to reflection and to improve signal integrity to packages coupled with controller 110 via DQ channels.

Media Package 0 and Media Package 1 are illustrated to include register (REG) 150. Register 150 represents one or more configuration registers for the memory dies. While shown in the package itself, in one example, each memory die, Die 0 and Die 1, includes register 150. In one example, Media Package 0 and Media Package 1 include configuration registers for their respective memory dies.

Register 150 represents one or more storage devices or storage locations that provide configuration or settings for configuration to control the operation of the memory dies. In one example, register 150 is or includes a media status register (MSR), a mode register (MR), a multipurpose register, or other configuration register. Controller 110 can write to register 150 or program the register to set one or more fields within the register. The settings in the different fields can configure the memory devices to operate in different "modes". Thus, command information written to or programmed to register 150 can trigger different modes within Die 0 and Die 1. In one example, the configuration of register 150 can set a configuration for timing, ODT, driver configuration, or other I/O settings.

In one example, register 150 includes a field to selectively enable binary mode for the ODT signal line (ODT 0 for Media Package 0 and ODT 1 for Media Package 1). In one example, the field in register 150 can selectively enable an encoding mode for the ODT signal line. In one example, when the field is set to disable decoding of the ODT enable signal, the ODT circuit interprets the ODT enable signal line as single-bit binary signal line.

In binary mode, ODT 0 and ODT 1 will indicate whether ODT is to be applied (when the ODT signal line is asserted) or whether ODT is to be disabled (when the ODT signal line is de-asserted). In encoding mode, ODT 0 and ODT 1 will carry a sequence of bits to indicate a specific ODT to apply to the DQ signal lines, for example. Thus, instead of simply indicating on and off, ODT 0 and ODT 1 can indicate a specific impedance type or impedance value that should be applied by the terminating die.

System 100 represents ODT tables for Die 0 of Media Package 0 and for Die 0 of Media Package 1. In one example, the terminating device applies a termination in accordance with what is illustrated in the tables, based on receipt of different ODT encodings on their respective ODT signal lines. The encoding values in the table are merely illustrative. Any encoding could be used, where the controller and the media are configured with unique termination values corresponding to an encoding sequence.

In one example, controller 110 can determine from the specific media devices whether they support ODT encoding. For example, a controller could be implemented with media devices that support ODT encoding or with media devices that do not support ODT encoding. Thus, controller 110 can enable ODT encoding for media devices that support the feature. In one example, where ODT encoding is supported, controller 110 can determine the ODT value or ODT setting that a media device should apply in certain circumstances, based on the indications in the tables. Controller 110 can serially encode the value on the ODT pad of ODT 0 and ODT 1. Based on the value provided, the terminating Die 0 of the media packages decodes the serial ODT pad toggles to determine the ODT value to apply.

In one example, Die 0 of Media Package 0 will apply different termination based on what signal is encoded on ODT 0. Referring to the tables, the target refers to the die that has the address to be written or read. An indication of which die is the target die is typically provided on CA bus 140 by a chip select (CS) signal or a comparable signal. Each device can have a chip select or other unique signal line that the memory device can assert with a command encoding on CA bus 140. If a device receives a command encoding with the CS asserted, it is the target device and will execute the command. If a device receives the command encoding with the CS de-asserted, it is a non-target device and will not execute the command.

In one example, when Package 0, Die 0 or when Package 0, Die 1 is the target device for a read (RD) command, controller 110 encodes '000' to Die 0 of Package 0, to disable termination and cause the device to apply High-Z. In one example, when Package 0, Die 0 or when Package 0, Die 1 is the target device for a read (RD) command, controller 110 encodes '010' to Die 0 of Package 1, to cause the device to apply RTT_1, which is a read termination value. In one example, when Package 0, Die 0 or when Package 0, Die 1 is the target device for a write (WR) command, controller 110 encodes either '000' to Die 0 of Package 0, to cause the device to apply High-Z, or encodes '110' to cause the device to apply RTT_2, which is a write termination value. In one example, when Package 0, Die 0 or when Package 0, Die 1 is the target device for a write (WR) command, controller 110 encodes '110' to Die 0 of Package 1, to cause the device to apply RTT_2.

In one example, when Package 1, Die 0 or when Package 1, Die 1 is the target device for a read (RD) command, controller 110 encodes '010' to Die 0 of Package 0, to cause the device to apply RTT_1. In one example, when Package 1, Die 0 or when Package 1, Die 1 is the target device for a read (RD) command, controller 110 encodes '000' to Die 0 of Package 1, to cause the device to apply High-Z. In one example, when Package 1, Die 0 or when Package 1, Die 1 is the target device for a write (WR) command, controller 110 encodes '110' to Die 0 of Package 0, to cause the device to apply RTT_2. In one example, when Package 1, Die 0 or when Package 1, Die 1 is the target device for a write (WR) command, controller 110 encodes either '000' to Die 0 of Package 1, to cause the device to apply High-Z, or encodes '110' to cause the device to apply RTT_2.

Simulation of the application of the above termination values for two QDP devices on the same channel showed an increase in the channel frequency that exceeded 10%. Additionally, the use of specific termination values for reach and write allowed the system to reduce the termination power by half. In the simulation, one of the four dies to package was selected as a terminator. Similar values and configurations for termination were applied as illustrated in the tables of system 100, where the additional two dies per channel were treated similarly as Die 1 of Media Package 0 and Die 1 of Media Package 1. Thus, when the additional dies were included per package, the termination values for read and write were selected based on whether the other dies were in the same package or in a different package.

Figure 1B:
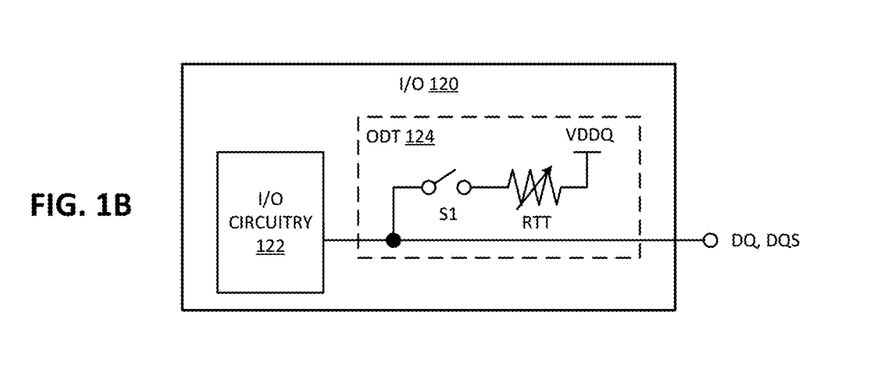
FIG. 1B is a block diagram of an example of on-die termination in accordance with FIG. 1A.

FIG. 1B is a block diagram of an example of on-die termination in accordance with FIG. 1A. I/O 120 provides an example of I/O circuit for the different dies of Media Package 0 and Media Package 1 of system 100. I/O 120 represents a combination of I/O 122 and ODT 124.

I/O 120 provides a simple functional representation of an example of ODT. I/O 120 includes I/O circuitry 122 to transmit or receive a signal. In one example, the media dies apply ODT for DQ or the data signal lines, as well as for DQS or the data strobe lines, which provide a clock or synchronization signal for the DQ. Thus, as illustrated, I/O 120 applies ODT 124 to DQ and DQS signal lines.

I/O 120 can include ODT 124, which includes circuitry that can be illustrated as a simplified circuit with a switch S1 to selectively apply the termination, a variable impedance element RTT to apply differing impedance values in different conditions, and a source voltage VDDQ. ODT 124 can be selectively applied in accordance with mode register or other configuration. In one example, the value of RTT is determined by the sequence of bits received as a serial encoding on the ODT signal line. In one example, the different values of RTT can apply bus termination that would be manifested in reduced DQ/DQS voltage swing as opposed to having the same termination applied for each scenario.

Figure 2:
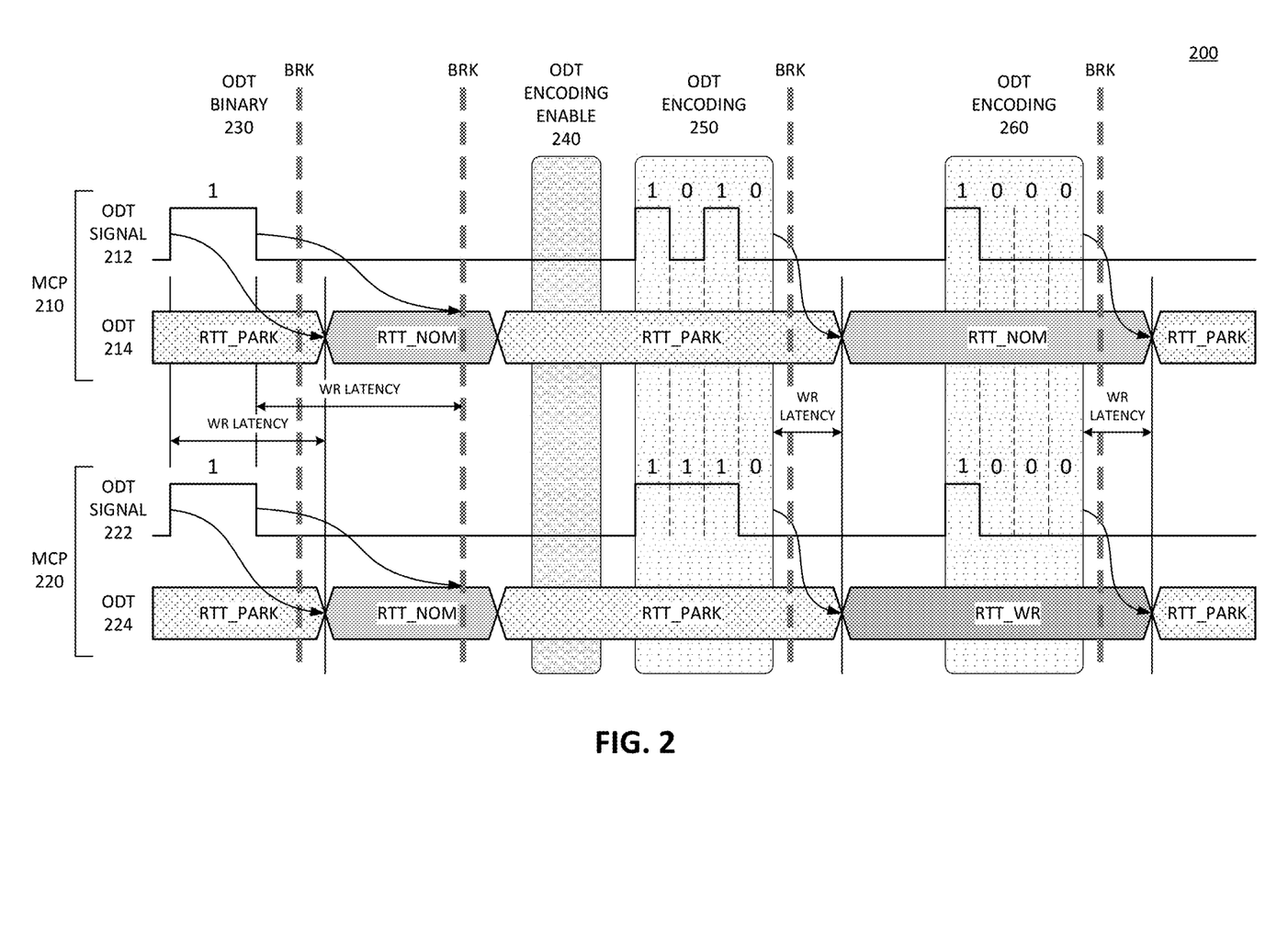
FIG. 2 is a timing diagram of an example of applying ODT with serial encoding for a system having multiple multichip packages.

FIG. 2 is a timing diagram of an example of applying ODT with serial encoding for a system having multiple multichip packages. Diagram 200 illustrates a timing diagram for a system in accordance with an example of system 100 of FIG. 1.

Diagram 200 illustrates a signaling representation for ODT signal 212 of MCP (multichip package) 210 and a signaling representation for ODT 214 of MCP 210. Diagram 200 illustrates a signaling representation for ODT signal 222 of MCP 220 and a signaling representation for ODT 224 of MCP 220. MCP 210 and MCP 220 represent two media package on the same memory channel with a controller. In one example MCP 210 and MCP 220 represent memory devices or storage devices.

ODT signal 212 represents signaling on an ODT pad corresponding to an ODT signal line between the controller and MCP 210. ODT signal 222 represents signaling on an ODT pad corresponding to an ODT signal line between the controller and MCP 220. ODT 214 illustrates the termination applied by a terminator of MCP 210. ODT 224 illustrates the termination applied by a terminator of MCP 220.

The dashed lines labeled BRK represent potential break points in the timing, indicating that more time could pass relative to the signaling shown. Thus, the timing is not necessarily to scale in diagram 200, and more or less time could pass, depending on the media type or device type that the ODT is applied to.

Diagram 200 illustrates a difference between a binary ODT signal and a serially encoded ODT signal. It will be understood that in a system where the media dies support serial encoding, there may not be any use for binary encoding. Thus, the different encodings on the same signal lines in diagram 200 is to be understood more for illustrative purposes than a suggestion of an operational system. The serial encoding to the right of the diagram can represent a snapshot of an operational system that has serial encoding enabled.

In one example, at the first time to the left of the diagram, binary signaling is enabled. ODT binary 230 represents an asserted signal line. Diagram 200 illustrates a '1' bit as an assertion of the signal line. In one example, rather than having the signal line typically low, and driving it high to indicate a logic 1, the signal line could typically remain high and be driven low to indicate a logic 0.

ODT binary 230 indicates that ODT signal 212 and ODT signal 222 are both asserted. With a binary ODT signal, only one value of ODT can be indicated. Thus, both ODT 214 and ODT 224 are illustrated as transitioning from RTT_PARK or a default termination impedance to RTT_NOM, which can represent a nominal termination impedance. The nominal termination impedance can be applied for read and write if there is no way to distinguish read and write.

The signaling to transition back from RTT_NOM to RTT_PARK is not illustrated after ODT binary 230. In one example, after some time, ODT encoding is enabled at 240. ODT encoding enables the controller to send, and the media die to receive, encoded signals on the ODT signal line. ODT encoding enable 240 can indicate a write to a configuration register to store configuration information. The configuration register can include a field to selectively enable the terminating die to decode multiple serial bits on the ODT signal line.

The ODT signal line is traditionally an ODT enable line. The multiple bits on the ODT signal line can be considered ODT encoding on an ODT enable line, illustrated as ODT encoding 250. In one example, ODT encoding 250 will trigger the terminator to apply a termination impedance based on the decoded signal. In one example, a system can include a media package that supports encoded signaling and a media package that does not support serial encoding. In one example, the encoded signal can trigger a media package that does not support serial encoding, if the encoded signals are start with a logic transition that would traditionally trigger a binary ODT enable response in the legacy media package that does not support serial encoding.

After enabling ODT encoding, in one example, while ODT 214 and ODT 224 are at the default termination of RTT_PARK, the controller encodes ODT signal 212 with '1010' and encoded ODT signal 222 with '1110'. In one example, the signal includes four bits, where the first bit is always a 1 to trigger the media die to read the ODT encoding. Thus, the first bit can be a trigger bit, and the remaining bits sent can be the signaling bits. The trigger bit can provide a logic transition on the respective ODT signal line to indicate the start of the encoding. The bits that follow the logic transition can provide the ODT encoding to apply.

In one example, the ODT state is changed only when a specific ODT input pattern is detected by the terminating media die. For example, in diagram 200, the controller encodes '1010' on ODT signal 212 to indicate to MCP 210 to apply RTT_NOM. In one example, the controller encodes '1110' on ODT signal 222 to indicate the MCP 220 to apply RTT_WR. RTT_WR can represent a write termination impedance.

After a time of write (WR) latency, ODT 214 transitions from RTT_PARK to RTT_NOM in accordance with the encoding received. After the write latency, ODT 224 transitions from RTT_PARK to RTT_WR in accordance with the encoding received. The terminating device can receive the signaling, decode the signaling, and trigger the application of the ODT. In one example, the serial encoding and decoding is possible because the time allowed between ODT triggering and application of ODT provides enough time to encode more than a binary ODT enable signal. Thus, DOT encoding can be used within the same amount of time configured for traditional binary ODT enable.

In one example, the controller triggers an encoding '1000' on both ODT signal 212 and ODT signal 222 during ODT encoding 260. In response to these signals, after write latency, ODT 214 transitions to RTT_PARK and ODT 224 also transitions to RTT_PARK. In one example, the terminating devices would maintain RTT_NOM and RTT_WR, respectively, until the controller signals the transition to RTT_PARK.

Figure 3:
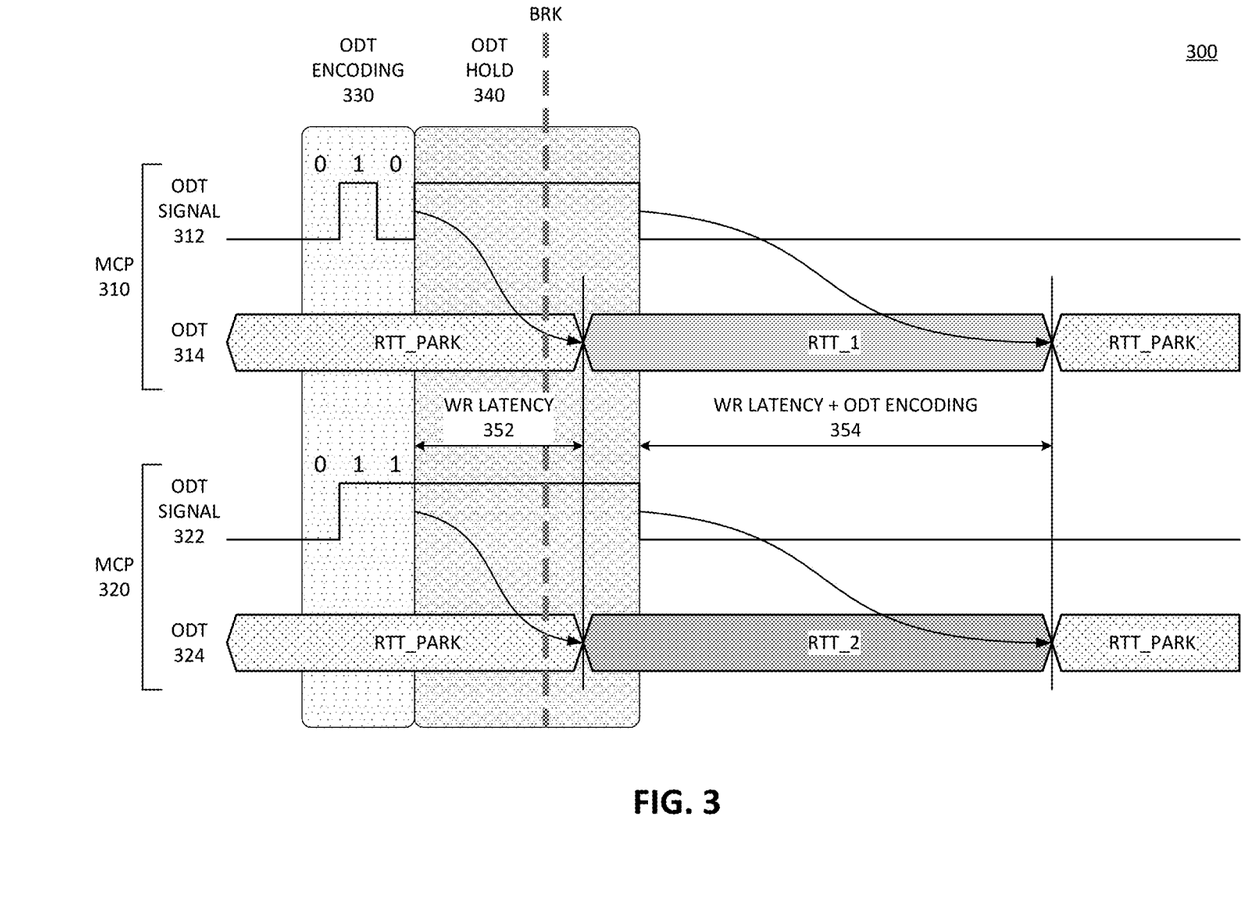
FIG. 3 is a timing diagram of an example of applying ODT with serial encoding and an ODT hold.

FIG. 3 is a timing diagram of an example of applying ODT with serial encoding and an ODT hold. Diagram 300 illustrates a timing diagram for a system in accordance with an example of system 100 of FIG. 1. Diagram 300 illustrates an alternative to diagram 200, in that the terminating device will hold the encoded termination for a configured period of time before automatically transitioning to a default termination or a High-Z state.

Diagram 300 illustrates a signaling representation for ODT signal 312 of MCP 310 and a signaling representation for ODT 314 of MCP 310. Diagram 300 illustrates a signaling representation for ODT signal 322 of MCP 320 and a signaling representation for ODT 324 of MCP 320. MCP 310 and MCP 320 represent two media package on the same memory channel with a controller.

ODT signal 312 represents signaling on an ODT pad corresponding to an ODT signal line between the controller and MCP 310. ODT signal 322 represents signaling on an ODT pad corresponding to an ODT signal line between the controller and MCP 320. ODT 314 illustrates the termination applied by a terminator of MCP 310. ODT 324 illustrates the termination applied by a terminator of MCP 320.

The dashed lines labeled BRK represent potential break points in the timing, indicating that more time could pass relative to the signaling shown. Thus, the timing is not necessarily to scale in diagram 300, and more or less time could pass, depending on the media type or device type that the ODT is applied to.

In one example, the ODT state is changed when a specific ODT input pattern is detected and held as long as the ODT signal remains in a specific state. In one example, the ODT state or application of ODT termination is held for as long as the ODT signal remains in a specific state plus an extension that allows for the next ODT input pattern encoding to be processed without impacting the ability to transition between ODT states without gaps. The extension can be a configured for a specific implementation that will depend on the system configuration, the signaling frequency, and the configuration of the media.

For diagram 300, the enabling of ODT encoding is assumed. Additionally, ODT signal 312 and ODT signal 322 represent only three bits of encoding. Such an encoding indicates that either the decoding of the signal line is triggered by a different mechanism (e.g., not by a logic 1 preceding the encoding on the ODT signal lines), or that diagram does not show the logic 1 transition. In one example, a 1 bit precedes the encoding. In one example, the terminating device is triggered to read and decode the ODT signal encoding by a different signal line or different trigger. For example, there can be a configured time between a sending of a command on the CA bus and signaling on the ODT signal line.

ODT encoding 330 represents a period where the controller sends ODT encoding on the ODT signal lines. In one example, the controller encodes '010' on ODT signal 312 to indicate to MCP 310 to apply RTT_1. In one example, the controller encodes '011' on ODT signal 322 to indicate the MCP 320 to apply RTT_2. RTT_1 and RTT_2 represent different values of termination to be applied at the different MCPs.

In one example, a time write (WR) latency 352 after ODT encoding 330, ODT 314 transitions from RTT_PARK to RTT_1 in accordance with the encoding received. After write latency 352, ODT 324 transitions from RTT_PARK to RTT_2 in accordance with the encoding received. The proposed mechanism to achieve RTT_1 and RTT_2 values being supported by the same terminator die is with an encoding on the ODT signals. In one example, RTT_1 or RTT_2 represents a read termination impedance. In one example, the read termination impedance is high impedance or high-Z.

In one example, after providing the ODT encoded signal on the ODT signal line, the controller holds ODT signal line 312 and ODT signal line 322 high during a period ODT hold 340. ODT hold 340 provides an extension of the ODT signal. Depending on the configuration of the system, the period ODT hold 340 can be longer than write latency 352. Whether ODT hold 340 is longer than write latency 352 can depend on the pipeline depth in the media relative to the access length (i.e., the burst length). Thus, after ODT 314 transitions to RTT_1 and ODT 324 transitions to RTT_2, the controller de-asserts ODT signal line 312 and ODT signal line 322. In one example, after write (WR) latency+ODT encoding 354 from the de-assertion of ODT signal 312 and ODT signal 322, ODT 314 transitions from RTT_1 to RTT_PARK and ODT 324 transitions from RTT_2 to RTT_PARK.

In one example, write latency+ODT encoding 354 is configured based on a minimum burst length for the media or device during which data is transmitted and termination needs to be applied. Thus, in one example, the controller can provide ODT encoding to cause the terminating device to apply an identified termination value, and then the terminating device will apply the termination value for a predetermined number of clock cycles or a predetermined period of time. After the predetermined number of clock cycles, the terminating device can automatically switch from applying the identified termination value to applying a default termination impedance or a high impedance.

Figure 4:
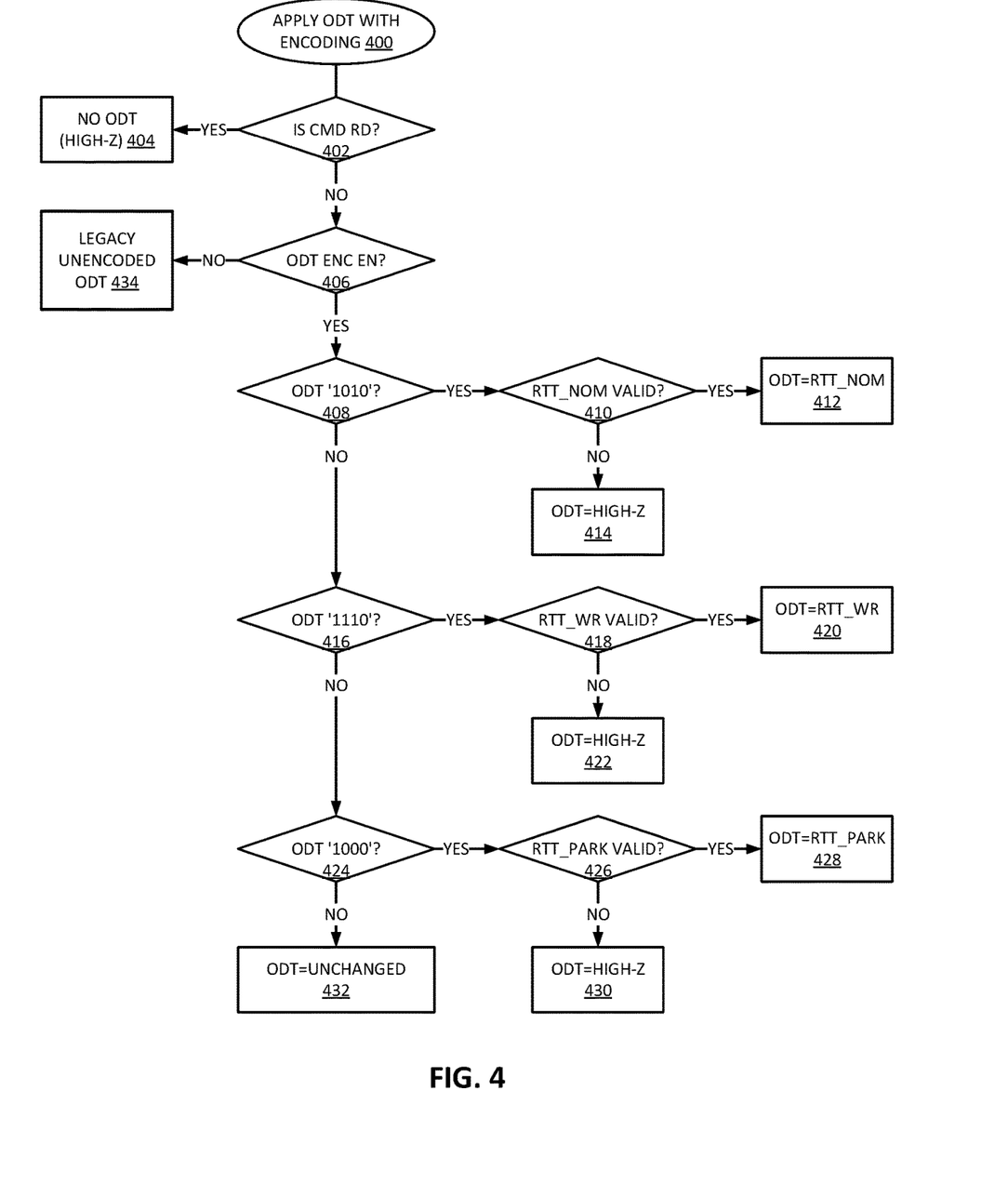
FIG. 4 is a flow diagram of an example of a process for applying ODT with serially encoded signals.

FIG. 4 is a flow diagram of an example of a process for applying ODT with serially encoded signals. Process 400 illustrates a process that can be applied by a terminating device. It will be understood that various operations within process 400 will depend on decisions made by and operations performed by an associated controller device. The specific values of encoding and the specific types of termination to apply are specific to an implementation. The values and types of termination are represented only as non-limiting examples, and countless other system implementations can be made based on the same concepts.

In one example, if a received command is a read (IS CMD RD), at 402, YES branch, in one example, the terminating device applies no ODT and sets the termination to high-Z, at 404. The test for the read command can be whether the read command is for the specific media package in which the terminating device is located. Reads to other media packages can be terminated in accordance with a different command encoding. In one example, if the command is not a target read to the media package of the terminating device, at 402 NO branch, in one example, the terminating device determines if ODT encoding is enabled (ODT ENC EN). If ODT encoding is not enabled, at 406 NO branch, in one example, the terminating device applies legacy unencoded ODT, at 434. Legacy unencoded ODT can refer to encoding based on a binary ODT signal, which may or may not include different termination values applied based on configuration register settings. Legacy in reference to process 400 simply means that the terminating device cannot decode a serial signal on the ODT signal line, but rather treats the signal line as a binary signal.

In one example, if ODT encoding is enabled, at 406 YES branch, in one example, the terminating device determines what encoding is provided on the ODT signal line. The following example are only examples, and other flows are possible.

If the ODT encoding is '1010', at 408 YES branch, in one example, the terminating device determines if RTT_NOM is enabled and has a value set. RTT_NOM can be enabled, for example, based on a configuration setting of a configuration register. The setting for the termination value of RTT_NOM can be provided by configuration setting. If RTT_NOM is valid, at 410 YES branch, in one example, the terminating device sets the ODT termination to RTT_NOM, at 412. If RTT_NOM is not valid, at 410 NO branch, in one example, the terminating device sets the ODT termination to high-Z, at 414.

If the ODT encoding is not '1010', at 408 NO branch, in one example, the terminating device determines if the ODT encoding is '1110'. If the ODT encoding is '1110', at 416 YES branch, the terminating device determines if RTT_WR is enabled and has a value set. RTT_WR can be enabled, for example, based on a configuration setting of a configuration register. The setting for the termination value of RTT_WR can be provided by configuration setting. If RTT_WR is valid, at 418 YES branch, in one example, the terminating device sets the ODT termination to RTT_WR, at 420. If RTT_WR is not valid, at 418 NO branch, in one example, the terminating device sets the ODT termination to high-Z, at 422.

If the ODT encoding is not '1110', at 416 NO branch, in one example, the terminating device determines if the ODT encoding is '1000'. If the ODT encoding is '1000', at 424 YES branch, the terminating device determines if RTT_PARK is enabled and has a value set. RTT_PARK can be enabled, for example, based on a configuration setting of a configuration register. The setting for the termination value of RTT_PARK can be provided by configuration setting. If RTT_PARK is valid, at 426 YES branch, in one example, the terminating device sets the ODT termination to RTT_PARK, at 428. If RTT_PARK is not valid, at 430 NO branch, in one example, the terminating device sets the ODT termination to high-Z, at 430. If the ODT encoding is not '1000', at 424 NO branch, in one example, the terminating device leaves the ODT termination unchanged, at 432. Leaving the termination unchanged indicates that whatever termination is currently being applied will continue to be applied until there is a transition in the termination value set.

Figure 5:
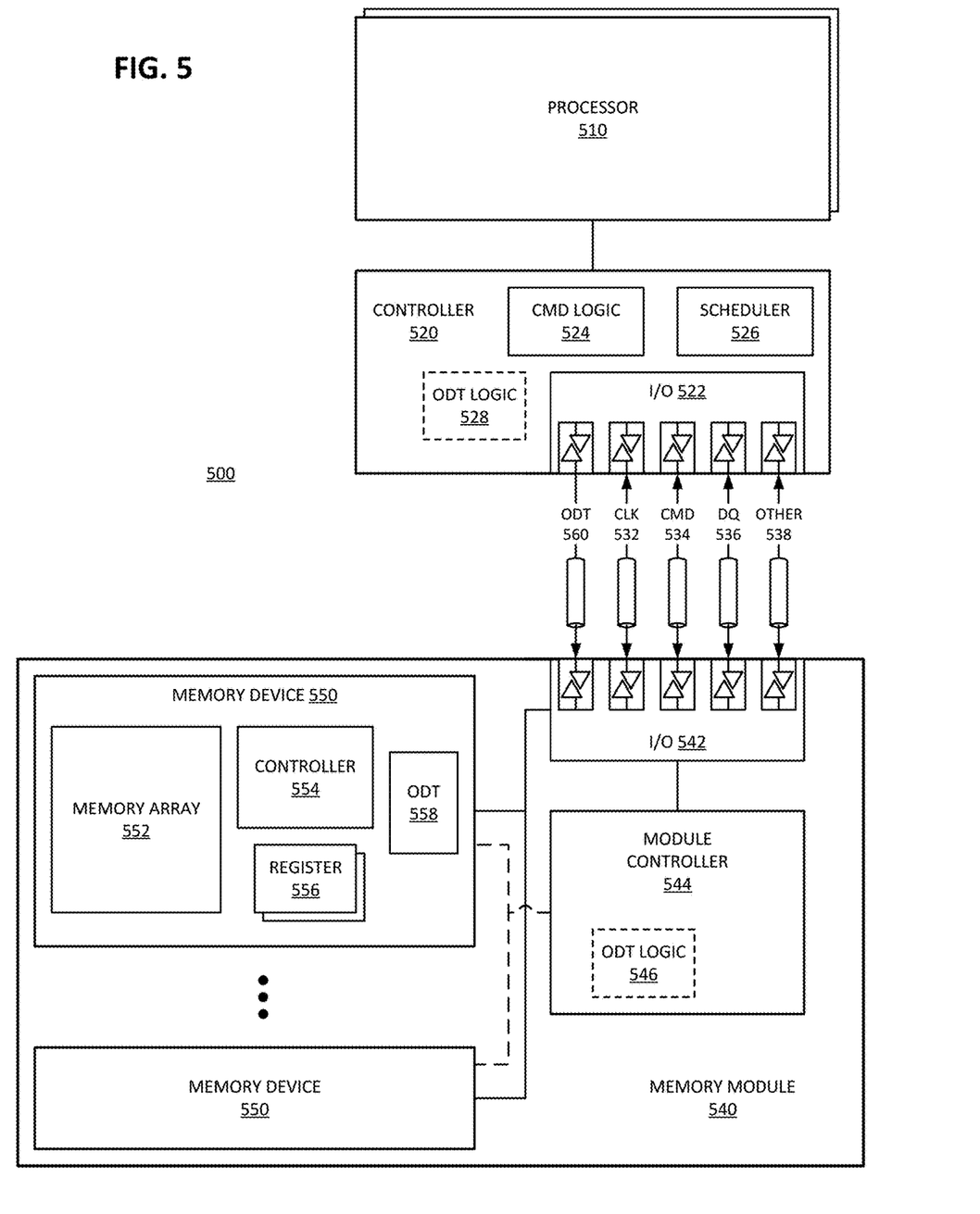
FIG. 5 is a block diagram of an example of a memory subsystem with a nonvolatile memory having ODT with optional serial encoding can be implemented.

FIG. 5 is a block diagram of an example of a memory subsystem with a nonvolatile memory having ODT with optional serial encoding can be implemented. System 500 includes a processor and elements of a memory subsystem in a computing device. System 500 includes a memory device that can be selectively enabled to decode a serially encoded termination signal on an ODT signal line.

Processor 510 represents a processing unit of a computing platform that may execute an operating system (OS) and applications, which can collectively be referred to as the host or the user of the memory. The OS and applications execute operations that result in memory accesses. Processor 510 can include one or more separate processors. Each separate processor can include a single processing unit, a multicore processing unit, or a combination. The processing unit can be a primary processor such as a CPU (central processing unit), a peripheral processor such as a GPU (graphics processing unit), or a combination. Memory accesses may also be initiated by devices such as a network controller or hard disk controller. Such devices can be integrated with the processor in some systems or attached to the processer via a bus (e.g., PCI express), or a combination. System 500 can be implemented as an SOC (system on a chip), or be implemented with standalone components.

Controller 520 represents one or more controller circuits or devices for system 500. Controller 520 represents control logic that generates memory access commands in response to the execution of operations by processor 510. Controller 520 accesses one or more memory devices 550. Memory devices 550 can include volatile memory devices or nonvolatile memory devices, or a combination of volatile and nonvolatile memory. In one example, memory devices 550 are organized and managed as different channels, where each channel couples to buses and signal lines that couple to multiple memory devices in parallel. Each channel is independently operable. Thus, each channel is independently accessed and controlled, and the timing, data transfer, command and address exchanges, and other operations are separate for each channel. Coupling can refer to an electrical coupling, communicative coupling, physical coupling, or a combination of these. Physical coupling can include direct contact. Electrical coupling includes an interface or interconnection that allows electrical flow between components, or allows signaling between components, or both. Communicative coupling includes connections, including wired or wireless, that enable components to exchange data.

In one example, each controller 520 manages a separate memory channel, although system 500 can be configured to have multiple channels managed by a single controller, or to have multiple controllers on a single channel. In one example, controller 520 is part of processor 510, such as logic implemented on the same die or implemented in the same package space as the processor.

Controller 520 includes I/O interface logic 522 to couple to a memory bus, such as a memory channel as referred to above. I/O interface logic 522 (as well as I/O interface logic 542 of memory module 540) can include pins, pads, connectors, signal lines, traces, or wires, or other hardware to connect the devices, or a combination of these. I/O interface logic 522 can include a hardware interface. As illustrated, I/O interface logic 522 includes at least drivers/transceivers for signal lines. Commonly, wires within an integrated circuit interface couple with a pad, pin, or connector to interface signal lines or traces or other wires between devices. I/O interface logic 522 can include drivers, receivers, transceivers, or termination, or other circuitry or combinations of circuitry to exchange signals on the signal lines between the devices. The exchange of signals includes at least one of transmit or receive. While shown as coupling I/O 522 from controller 520 to I/O 542 of memory module 540, it will be understood that memory devices 550 can be accessed in parallel, and each memory device would include I/O interfaces to I/O 542.

The bus between controller 520 and memory devices 550 can be implemented as multiple signal lines coupling memory controller 520 to memory devices 550. The bus may typically include at least clock (CLK) 532, command/address (CMD) 534, and write data (DQ) and read data (DQ) 536, and zero or more other signal lines 538. In one example, a bus or connection between memory controller 520 and memory can be referred to as a memory bus. The signal lines for CMD can be referred to as a "C/A bus" (or ADD/CMD bus, or some other designation indicating the transfer of commands (C or CMD) and address (A or ADD) information) and the signal lines for write and read DQ can be referred to as a "data bus." In one example, independent channels have different clock signals, C/A buses, data buses, and other signal lines. Thus, system 500 can be considered to have multiple "buses," in the sense that an independent interface path can be considered a separate bus. It will be understood that in addition to the lines explicitly shown, a bus can include at least one of strobe signaling lines, alert lines, auxiliary lines, or other signal lines, or a combination. It will also be understood that serial bus technologies can be used for the connection between controller 520 and memory devices 550. An example of a serial bus technology is 5B10B encoding and transmission of high-speed data with embedded clock over a single differential pair of signals in each direction. In one example, CMD 534 represents signal lines shared in parallel with multiple memory devices. In one example, multiple memory devices share encoding command signal lines of CMD 534, and each has a separate chip select (CS_n) signal line to select individual memory devices.

In one example, I/O 522 includes multiple ODT signal lines ODT 560. ODT 560 represents signal lines between controller 520 and each memory device 550. In one example, I/O 522 does not include ODT 560. Instead, ODT 560 can be between module controller 544 and each memory device 550. For example, module controller 544 can receive commands from controller 520, which represents a host system, and generate commands within memory module 540 to implement the command received from the host, including generating read and write commands and ODT signaling associated with the commands.

In one example, memory devices 550 and memory controller 520 exchange data over the data bus in a burst, or a sequence of consecutive data transfers. The burst corresponds to a number of transfer cycles, which is related to a bus frequency. In one example, the transfer cycle can be a whole clock cycle for transfers occurring on a same clock or strobe signal edge (e.g., on the rising edge). In one example, every clock cycle, referring to a cycle of the system clock, is separated into multiple unit intervals (UIs), where each UI is a transfer cycle. For example, double data rate transfers trigger on both edges of the clock signal (e.g., rising and falling). A burst can last for a configured number of UIs, which can be a configuration stored in a register, or triggered on the fly. For example, a sequence of eight consecutive transfer periods can be considered a burst length 8 (BL8), and each memory device 550 can transfer data on each UI. Thus, a x8 memory device operating on BL8 can transfer 64 bits of data (8 data signal lines times 8 data bits transferred per line over the burst). It will be understood that this simple example is merely an illustration and is not limiting.

Memory devices 550 represent memory resources for system 500. Memory array 552 represents the memory resources, including memory cells or storage cells that hold the data. For a Write operation, an individual memory device 550 can write a portion of an overall data word in a parallel configuration or the whole word in a different configuration. Similarly, for a Read operation, an individual memory device 550 can fetch a portion of the overall data word or the entire data word.

In one example, memory devices 550 are disposed directly on a motherboard or host system platform (e.g., a PCB (printed circuit board) on which processor 510 is disposed) of a computing device. In one example, memory devices 550 can be organized into memory module 540. In one example, memory module 540 represents a dual inline memory module (DIMM). In one example, memory module 540 represent other organization of multiple memory devices to share at least a portion of access or control circuitry, which can be a separate circuit, a separate device, or a separate board (e.g., PCB) from the host system platform. In one example, memory devices 550 may be incorporated into the same package as memory controller 520, such as by techniques such as multi-chip-module (MCM), package-on-package, through-silicon via (TSV), or other techniques or combinations. Similarly, in one example, multiple memory devices 550 may be incorporated into memory modules 540, which themselves may be incorporated into the same package as memory controller 520. It will be appreciated that for these and other implementations, memory controller 520 may be part of host processor 510.

Memory module 540 includes module controller 544, which represents control logic on the memory module board, such as a controller or register device on a memory module PCB. In one example, module controller 544 represents a register clock device or other application specific integrated circuit (ASIC) device. Module controller 544 can control the exchange of commands to memory devices 550. In one example, module controller 544 manages ECC on memory module 540.

In one example, memory devices 550 include one or more registers 556. Register 556 represents one or more storage devices or storage locations that provide configuration or settings for the operation of the memory device. In one example, register 556 can provide a storage location for memory device 550 to store data for access by memory controller 520 as part of a control or management operation. The configuration of locations within register 556 can configure memory device 550 to operate in different "modes," where command information can trigger different operations within memory device 550 based on the mode.

Memory device 550 includes controller 554, which represents control logic within the memory device to control internal operations within the memory device. For example, controller 554 decodes commands sent by memory controller 520 and generates internal operations to execute or satisfy the commands. Controller 554 can be referred to as an internal controller, and is separate from memory controller 520 of the host.

Referring again to memory controller 520, memory controller 520 includes command (CMD) logic 524, which represents logic or circuitry to generate commands to send to memory devices 550. The generation of the commands can refer to the command prior to scheduling, or the preparation of queued commands ready to be sent. Generally, the signaling in memory subsystems includes address information within or accompanying the command to indicate or select one or more memory locations where the memory devices should execute the command. In response to scheduling of transactions, memory controller 520 can issue commands via I/O 522 to cause memory device 550 to execute the commands.

In one example, controller 554 of memory device 550 receives and decodes command and address information received via I/O 542 from memory controller 520. Based on the received command and address information, controller 554 can control the timing of operations of the logic and circuitry within memory device 550 to execute the commands. Controller 554 is responsible for compliance with standards or specifications within memory device 550, such as timing and signaling requirements. Memory controller 520 can implement compliance with standards or specifications by access scheduling and control.

Memory controller 520 includes scheduler 526, which represents logic or circuitry to generate and order transactions to send to memory device 550. From one perspective, the primary function of memory controller 520 could be said to schedule memory access and other transactions to memory device 550. Such scheduling can include generating the transactions themselves to implement the requests for data by processor 510 and to maintain integrity of the data (e.g., such as with commands related to refresh). Transactions can include one or more commands, and result in the transfer of commands or data or both over one or multiple timing cycles such as clock cycles or unit intervals. Transactions can be for access such as read or write or related commands or a combination, and other transactions can include memory management commands for configuration, settings, data integrity, or other commands or a combination.

In one example, where controller 520 generates ODT signaling for memory devices 550, controller 520 can include ODT logic 528 to generate ODT signaling based on commands to be generated and sent from command logic 524. In one example, ODT logic 528 is part of command logic 524. In one example, ODT logic 528 determines to configure memory devices 550 for serial encoding on the ODT signal lines. ODT logic 528 can perform controller ODT signaling in accordance with any example described.

In one example, where controller 544 generates ODT signaling for memory devices 550, controller 544 can include ODT logic 546 to generate ODT signaling based on commands to be generated to memory device 550. In one example, ODT logic 546 determines to configure memory devices 550 for serial encoding on the ODT signal lines. ODT logic 546 can perform controller ODT signaling in accordance with any example described. ODT 558 represents the ODT circuitry in memory device 550 to apply the ODT termination value determined the ODT logic that triggers the application of ODT.

Reference to memory devices can apply to nonvolatile memory device whose state is determinate even if power is interrupted to the device. In one example, the nonvolatile memory device is a block addressable memory device, such as NAND or NOR technologies. Thus, a memory device can also include a future generation nonvolatile devices, such as a three dimensional crosspoint memory device, whether byte addressable or block addressable, other byte addressable nonvolatile memory devices, or memory devices that use chalcogenide phase change material (e.g., chalcogenide glass), or resistance-based memory devices that store data based on a resistive state of a cell. In one example, the memory device can be or include multi-threshold level NAND flash memory, NOR flash memory, single or multi-level phase change memory (PCM) or phase change memory with a switch (PCMS), a resistive memory, nanowire memory, ferroelectric transistor random access memory (FeTRAM), magnetoresistive random access memory (MRAM) memory that incorporates memristor technology, or spin transfer torque (STT)-MRAM, or a combination of any of the above, or other memory.

Figure 6:
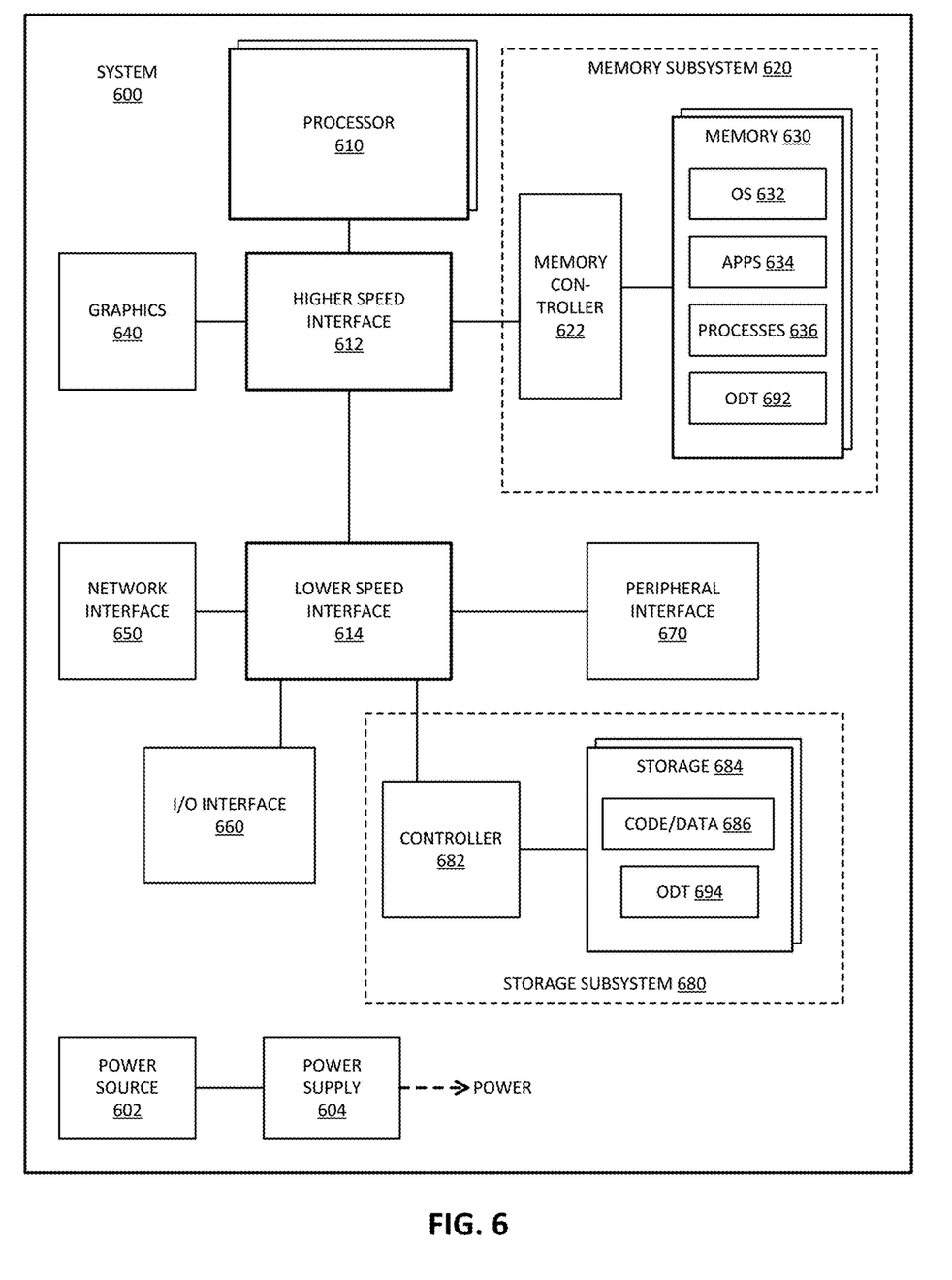
FIG. 6 is a block diagram of an example of a computing system with a nonvolatile memory having ODT with optional serial encoding can be implemented.

FIG. 6 is a block diagram of an example of a computing system with a nonvolatile memory having ODT with optional serial encoding can be implemented. System 600 represents a computing device in accordance with any example herein, and can be a laptop computer, a desktop computer, a tablet computer, a server, a gaming or entertainment control system, embedded computing device, or other electronic device.

System 600 provides an example of a system that can include memory that can apply ODT based on an encoded signal on an ODT signal line, in accordance with any example described. System 600 can be an example of a system in accordance with system 100. System 600 can include an example of a memory system in accordance with system 500. In one example, memory subsystem 620 includes memory 630 that has ODT 692, which can be applied to various different termination levels in response to a serially encoded ODT signal. ODT 692 can selectively enable the application of different termination levels in response to an ODT signal encoding in accordance with any example herein. In one example, storage subsystem 680 includes storage 684 that has ODT 694, which can be applied to various different termination levels in response to a serially encoded ODT signal. ODT 694 can selectively enable the application of different termination levels in response to an ODT signal encoding in accordance with any example herein.

System 600 includes processor 610 can include any type of microprocessor, central processing unit (CPU), graphics processing unit (GPU), processing core, or other processing hardware, or a combination, to provide processing or execution of instructions for system 600. Processor 610 can be a host processor device. Processor 610 controls the overall operation of system 600, and can be or include, one or more programmable general-purpose or special-purpose microprocessors, digital signal processors (DSPs), programmable controllers, application specific integrated circuits (ASICs), programmable logic devices (PLDs), or a combination of such devices.

In one example, system 600 includes interface 612 coupled to processor 610, which can represent a higher speed interface or a high throughput interface for system components that need higher bandwidth connections, such as memory subsystem 620 or graphics interface components 640. Interface 612 represents an interface circuit, which can be a standalone component or integrated onto a processor die. Interface 612 can be integrated as a circuit onto the processor die or integrated as a component on a system on a chip. Where present, graphics interface 640 interfaces to graphics components for providing a visual display to a user of system 600. Graphics interface 640 can be a standalone component or integrated onto the processor die or system on a chip. In one example, graphics interface 640 can drive a high definition (HD) display or ultra high definition (UHD) display that provides an output to a user. In one example, the display can include a touchscreen display. In one example, graphics interface 640 generates a display based on data stored in memory 630 or based on operations executed by processor 610 or both.

Memory subsystem 620 represents the main memory of system 600, and provides storage for code to be executed by processor 610, or data values to be used in executing a routine. Memory subsystem 620 can include one or more memory devices 630 such as read-only memory (ROM), flash memory, one or more varieties of random-access memory (RAM) such as DRAM, 3DXP (three-dimensional crosspoint), or other memory devices, or a combination of such devices. Memory 630 stores and hosts, among other things, operating system (OS) 632 to provide a software platform for execution of instructions in system 600. Additionally, applications 634 can execute on the software platform of OS 632 from memory 630. Applications 634 represent programs that have their own operational logic to perform execution of one or more functions. Processes 636 represent agents or routines that provide auxiliary functions to OS 632 or one or more applications 634 or a combination. OS 632, applications 634, and processes 636 provide software logic to provide functions for system 600. In one example, memory subsystem 620 includes memory controller 622, which is a memory controller to generate and issue commands to memory 630. It will be understood that memory controller 622 could be a physical part of processor 610 or a physical part of interface 612. For example, memory controller 622 can be an integrated memory controller, integrated onto a circuit with processor 610, such as integrated onto the processor die or a system on a chip.

While not specifically illustrated, it will be understood that system 600 can include one or more buses or bus systems between devices, such as a memory bus, a graphics bus, interface buses, or others. Buses or other signal lines can communicatively or electrically couple components together, or both communicatively and electrically couple the components. Buses can include physical communication lines, point-to-point connections, bridges, adapters, controllers, or other circuitry or a combination. Buses can include, for example, one or more of a system bus, a Peripheral Component Interconnect (PCI) bus, a HyperTransport or industry standard architecture (ISA) bus, a small computer system interface (SCSI) bus, a universal serial bus (USB), or other bus, or a combination.

In one example, system 600 includes interface 614, which can be coupled to interface 612. Interface 614 can be a lower speed interface than interface 612. In one example, interface 614 represents an interface circuit, which can include standalone components and integrated circuitry. In one example, multiple user interface components or peripheral components, or both, couple to interface 614. Network interface 650 provides system 600 the ability to communicate with remote devices (e.g., servers or other computing devices) over one or more networks. Network interface 650 can include an Ethernet adapter, wireless interconnection components, cellular network interconnection components, USB (universal serial bus), or other wired or wireless standards-based or proprietary interfaces. Network interface 650 can exchange data with a remote device, which can include sending data stored in memory or receiving data to be stored in memory.

In one example, system 600 includes one or more input/output (I/O) interface(s) 660. I/O interface 660 can include one or more interface components through which a user interacts with system 600 (e.g., audio, alphanumeric, tactile/touch, or other interfacing). Peripheral interface 670 can include any hardware interface not specifically mentioned above. Peripherals refer generally to devices that connect dependently to system 600. A dependent connection is one where system 600 provides the software platform or hardware platform or both on which operation executes, and with which a user interacts.

In one example, system 600 includes storage subsystem 680 to store data in a nonvolatile manner. In one example, in certain system implementations, at least certain components of storage 680 can overlap with components of memory subsystem 620. Storage subsystem 680 includes storage device(s) 684, which can be or include any conventional medium for storing large amounts of data in a nonvolatile manner, such as one or more magnetic, solid state, 3DXP, or optical based disks, or a combination. Storage 684 holds code or instructions and data 686 in a persistent state (i.e., the value is retained despite interruption of power to system 600). Storage 684 can be generically considered to be a "memory," although memory 630 is typically the executing or operating memory to provide instructions to processor 610. Whereas storage 684 is nonvolatile, memory 630 can include volatile memory (i.e., the value or state of the data is indeterminate if power is interrupted to system 600). In one example, storage subsystem 680 includes controller 682 to interface with storage 684. In one example controller 682 is a physical part of interface 614 or processor 610, or can include circuits or logic in both processor 610 and interface 614.

Power source 602 provides power to the components of system 600. More specifically, power source 602 typically interfaces to one or multiple power supplies 604 in system 600 to provide power to the components of system 600. In one example, power supply 604 includes an AC to DC (alternating current to direct current) adapter to plug into a wall outlet. Such AC power can be renewable energy (e.g., solar power) power source 602. In one example, power source 602 includes a DC power source, such as an external AC to DC converter. In one example, power source 602 or power supply 604 includes wireless charging hardware to charge via proximity to a charging field. In one example, power source 602 can include an internal battery or fuel cell source.

Figure 7:
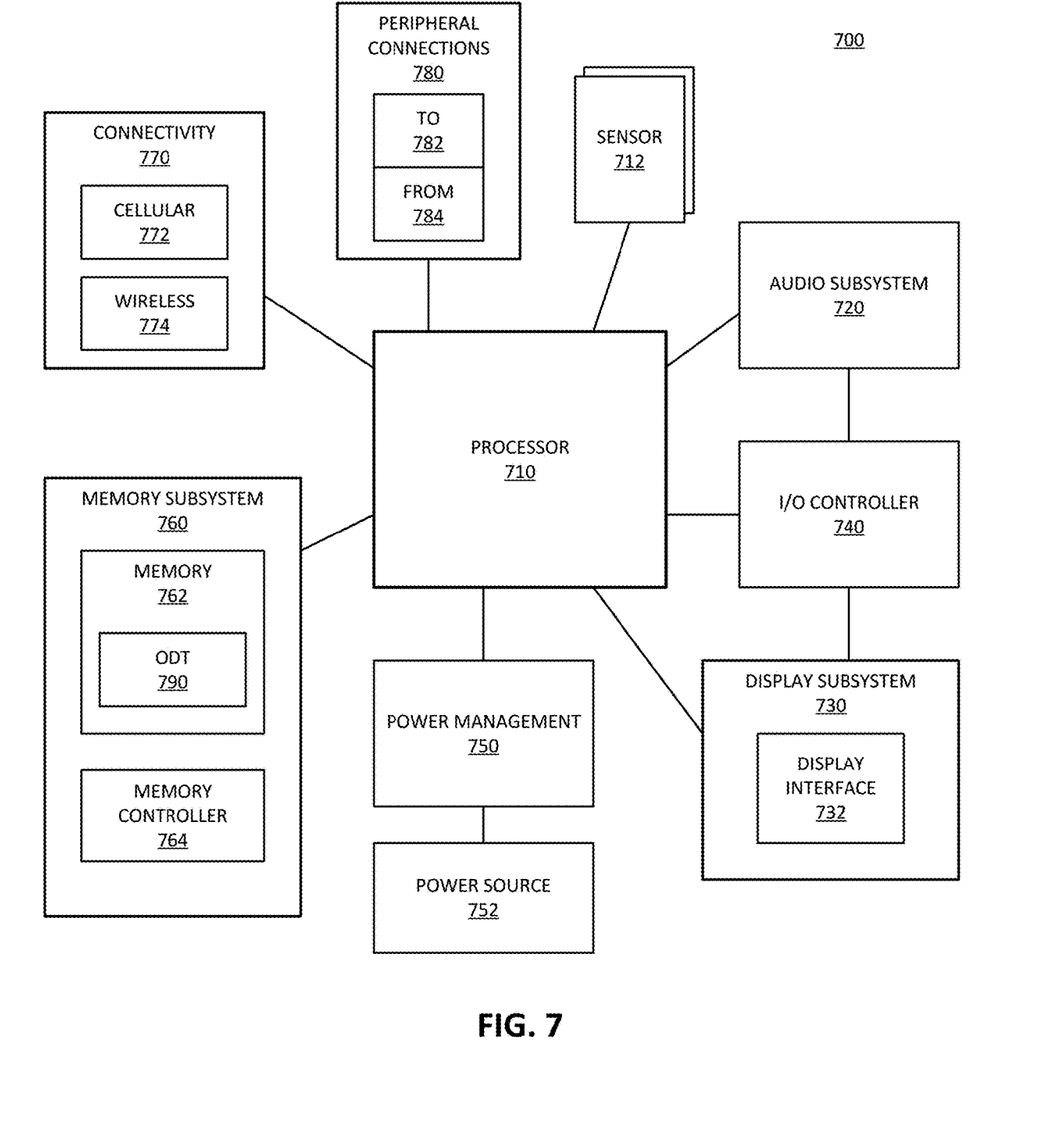
FIG. 7 is a block diagram of an example of a mobile device with a nonvolatile memory having ODT with optional serial encoding can be implemented.

FIG. 7 is a block diagram of an example of a mobile device with a nonvolatile memory having ODT with optional serial encoding can be implemented. System 700 represents a mobile computing device, such as a computing tablet, a mobile phone or smartphone, wearable computing device, or other mobile device, or an embedded computing device. It will be understood that certain of the components are shown generally, and not all components of such a device are shown in system 700.

System 700 provides an example of a system that can include memory that can apply ODT based on an encoded signal on an ODT signal line, in accordance with any example described. System 700 can be an example of a system in accordance with system 100. System 700 can include an example of a memory system in accordance with system 500. In one example, memory subsystem 760 includes memory 762 that has ODT 790, which can be applied to various different termination levels in response to a serially encoded ODT signal. ODT 790 can selectively enable the application of different termination levels in response to an ODT signal encoding in accordance with any example herein.

System 700 includes processor 710, which performs the primary processing operations of system 700. Processor 710 can be a host processor device. Processor 710 can include one or more physical devices, such as microprocessors, application processors, microcontrollers, programmable logic devices, or other processing means. The processing operations performed by processor 710 include the execution of an operating platform or operating system on which applications and device functions are executed. The processing operations include operations related to I/O (input/output) with a human user or with other devices, operations related to power management, operations related to connecting system 700 to another device, or a combination. The processing operations can also include operations related to audio I/O, display I/O, or other interfacing, or a combination. Processor 710 can execute data stored in memory. Processor 710 can write or edit data stored in memory.

In one example, system 700 includes one or more sensors 712. Sensors 712 represent embedded sensors or interfaces to external sensors, or a combination. Sensors 712 enable system 700 to monitor or detect one or more conditions of an environment or a device in which system 700 is implemented. Sensors 712 can include environmental sensors (such as temperature sensors, motion detectors, light detectors, cameras, chemical sensors (e.g., carbon monoxide, carbon dioxide, or other chemical sensors)), pressure sensors, accelerometers, gyroscopes, medical or physiology sensors (e.g., biosensors, heart rate monitors, or other sensors to detect physiological attributes), or other sensors, or a combination. Sensors 712 can also include sensors for biometric systems such as fingerprint recognition systems, face detection or recognition systems, or other systems that detect or recognize user features. Sensors 712 should be understood broadly, and not limiting on the many different types of sensors that could be implemented with system 700. In one example, one or more sensors 712 couples to processor 710 via a frontend circuit integrated with processor 710. In one example, one or more sensors 712 couples to processor 710 via another component of system 700.

In one example, system 700 includes audio subsystem 720, which represents hardware (e.g., audio hardware and audio circuits) and software (e.g., drivers, codecs) components associated with providing audio functions to the computing device. Audio functions can include speaker or headphone output, as well as microphone input. Devices for such functions can be integrated into system 700, or connected to system 700. In one example, a user interacts with system 700 by providing audio commands that are received and processed by processor 710.

Display subsystem 730 represents hardware (e.g., display devices) and software components (e.g., drivers) that provide a visual display for presentation to a user. In one example, the display includes tactile components or touchscreen elements for a user to interact with the computing device. Display subsystem 730 includes display interface 732, which includes the particular screen or hardware device used to provide a display to a user. In one example, display interface 732 includes logic separate from processor 710 (such as a graphics processor) to perform at least some processing related to the display. In one example, display subsystem 730 includes a touchscreen device that provides both output and input to a user. In one example, display subsystem 730 includes a high definition (HD) or ultra-high definition (UHD) display that provides an output to a user. In one example, display subsystem includes or drives a touchscreen display. In one example, display subsystem 730 generates display information based on data stored in memory or based on operations executed by processor 710 or both.

I/O controller 740 represents hardware devices and software components related to interaction with a user. I/O controller 740 can operate to manage hardware that is part of audio subsystem 720, or display subsystem 730, or both. Additionally, I/O controller 740 illustrates a connection point for additional devices that connect to system 700 through which a user might interact with the system. For example, devices that can be attached to system 700 might include microphone devices, speaker or stereo systems, video systems or other display device, keyboard or keypad devices, buttons/switches, or other I/O devices for use with specific applications such as card readers or other devices.

As mentioned above, I/O controller 740 can interact with audio subsystem 720 or display subsystem 730 or both. For example, input through a microphone or other audio device can provide input or commands for one or more applications or functions of system 700. Additionally, audio output can be provided instead of or in addition to display output. In another example, if display subsystem includes a touchscreen, the display device also acts as an input device, which can be at least partially managed by I/O controller 740. There can also be additional buttons or switches on system 700 to provide I/O functions managed by I/O controller 740.

In one example, I/O controller 740 manages devices such as accelerometers, cameras, light sensors or other environmental sensors, gyroscopes, global positioning system (GPS), or other hardware that can be included in system 700, or sensors 712. The input can be part of direct user interaction, as well as providing environmental input to the system to influence its operations (such as filtering for noise, adjusting displays for brightness detection, applying a flash for a camera, or other features).

In one example, system 700 includes power management 750 that manages battery power usage, charging of the battery, and features related to power saving operation. Power management 750 manages power from power source 752, which provides power to the components of system 700. In one example, power source 752 includes an AC to DC (alternating current to direct current) adapter to plug into a wall outlet. Such AC power can be renewable energy (e.g., solar power, motion based power). In one example, power source 752 includes only DC power, which can be provided by a DC power source, such as an external AC to DC converter. In one example, power source 752 includes wireless charging hardware to charge via proximity to a charging field. In one example, power source 752 can include an internal battery or fuel cell source.

Memory subsystem 760 includes memory device(s) 762 for storing information in system 700. Memory subsystem 760 can include nonvolatile (state does not change if power to the memory device is interrupted) or volatile (state is indeterminate if power to the memory device is interrupted) memory devices, or a combination. Memory 760 can store application data, user data, music, photos, documents, or other data, as well as system data (whether long-term or temporary) related to the execution of the applications and functions of system 700. In one example, memory subsystem 760 includes memory controller 764 (which could also be considered part of the control of system 700, and could potentially be considered part of processor 710). Memory controller 764 includes a scheduler to generate and issue commands to control access to memory device 762.

Connectivity 770 includes hardware devices (e.g., wireless or wired connectors and communication hardware, or a combination of wired and wireless hardware) and software components (e.g., drivers, protocol stacks) to enable system 700 to communicate with external devices. The external device could be separate devices, such as other computing devices, wireless access points or base stations, as well as peripherals such as headsets, printers, or other devices. In one example, system 700 exchanges data with an external device for storage in memory or for display on a display device. The exchanged data can include data to be stored in memory, or data already stored in memory, to read, write, or edit data.

Connectivity 770 can include multiple different types of connectivity. To generalize, system 700 is illustrated with cellular connectivity 772 and wireless connectivity 774. Cellular connectivity 772 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, LTE (long term evolution—also referred to as "4G"), 5G, or other cellular service standards. Wireless connectivity 774 refers to wireless connectivity that is not cellular, and can include personal area networks (such as Bluetooth), local area networks (such as WiFi), or wide area networks (such as WiMax), or other wireless communication, or a combination. Wireless communication refers to transfer of data through the use of modulated electromagnetic radiation through a non-solid medium. Wired communication occurs through a solid communication medium.

Peripheral connections 780 include hardware interfaces and connectors, as well as software components (e.g., drivers, protocol stacks) to make peripheral connections. It will be understood that system 700 could both be a peripheral device ("to" 782) to other computing devices, as well as have peripheral devices ("from" 784) connected to it. System 700 commonly has a "docking" connector to connect to other computing devices for purposes such as managing (e.g., downloading, uploading, changing, synchronizing) content on system 700. Additionally, a docking connector can allow system 700 to connect to certain peripherals that allow system 700 to control content output, for example, to audiovisual or other systems.

In addition to a proprietary docking connector or other proprietary connection hardware, system 700 can make peripheral connections 780 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), or other type.

In general with respect to the descriptions herein, in one example, an apparatus includes: an on-die termination (ODT) circuit to apply one of multiple termination impedances; and an ODT enable signal line to receive an ODT enable signal as multiple serial bits to encode a selected termination impedance; wherein the ODT circuit is to apply the selected termination impedance in response to the ODT enable signal.

In one example of the apparatus, the multiple termination impedances include a write termination impedance. In any preceding example of the apparatus, the multiple termination impedances include a read termination impedance. In any preceding example of the apparatus, the multiple termination impedances include a default termination impedance. In any preceding example of the apparatus, the ODT circuit is to apply the selected termination impedance for a predetermined number of clock cycles, and then automatically switch to apply the default termination impedance. In any preceding example of the apparatus, the ODT enable signal is triggered by a logic transition on the ODT enable signal line, followed by the multiple serial bits. For any preceding example of the apparatus, and further including: a register to store configuration information, the register including a field to selectively enable decoding of the multiple serial bits of the ODT enable signal. In any preceding example of the apparatus, when the field is set to disable decoding of the multiple serial bits of the ODT enable signal, the ODT circuit is to interpret the ODT enable signal line as single-bit binary signal line. In any preceding example of the apparatus, the ODT circuit comprises an ODT circuit of a memory device.

In general with respect to the descriptions herein, in one example, a system includes: a controller; and a memory device coupled to the controller, the memory device including an on-die termination (ODT) circuit to apply one of multiple termination impedances; and an ODT enable signal line to receive an ODT enable signal as multiple serial bits to encode a selected termination impedance; wherein the ODT circuit is to apply the selected termination impedance in response to the ODT enable signal.

In one example of the system, the multiple termination impedances include a write termination impedance. In any preceding example of the system, the multiple termination impedances include a read termination impedance. In any preceding example of the apparatus, the multiple termination impedances include a default termination impedance. In any preceding example of the system, the ODT circuit is to apply the selected termination impedance for a predetermined number of clock cycles, and then automatically switch to apply the default termination impedance. In any preceding example of the system, the ODT enable signal is triggered by a logic transition on the ODT enable signal line, followed by the multiple serial bits. In any preceding example of the system, the memory device further comprising: register to store configuration information, the register including a field to selectively enable decoding of the multiple serial bits of the ODT enable signal. In any preceding example of the system, when the field is set to disable decoding of the multiple serial bits of the ODT enable signal, the ODT circuit is to interpret the ODT enable signal line as single-bit binary signal line. For any preceding example of the system, and further including one or more of: a host processor device coupled to the controller; a display communicatively coupled to a host processor; a network interface communicatively coupled to a host processor; or a battery to power the system.

Flow diagrams as illustrated herein provide examples of sequences of various process actions. The flow diagrams can indicate operations to be executed by a software or firmware routine, as well as physical operations. A flow diagram can illustrate an example of the implementation of states of a finite state machine (FSM), which can be implemented in hardware and/or software. Although shown in a particular sequence or order, unless otherwise specified, the order of the actions can be modified. Thus, the illustrated diagrams should be understood only as examples, and the process can be performed in a different order, and some actions can be performed in parallel. Additionally, one or more actions can be omitted; thus, not all implementations will perform all actions.

To the extent various operations or functions are described herein, they can be described or defined as software code, instructions, configuration, and/or data. The content can be directly executable ("object" or "executable" form), source code, or difference code ("delta" or "patch" code). The software content of what is described herein can be provided via an article of manufacture with the content stored thereon, or via a method of operating a communication interface to send data via the communication interface. A machine readable storage medium can cause a machine to perform the functions or operations described, and includes any mechanism that stores information in a form accessible by a machine (e.g., computing device, electronic system, etc.), such as recordable/non-recordable media (e.g., read only memory (ROM), random access memory (RAM), magnetic disk storage media, optical storage media, flash memory devices, etc.). A communication interface includes any mechanism that interfaces to any of a hardwired, wireless, optical, etc., medium to communicate to another device, such as a memory bus interface, a processor bus interface, an Internet connection, a disk controller, etc. The communication interface can be configured by providing configuration parameters and/or sending signals to prepare the communication interface to provide a data signal describing the software content. The communication interface can be accessed via one or more commands or signals sent to the communication interface.

Various components described herein can be a means for performing the operations or functions described. Each component described herein includes software, hardware, or a combination of these. The components can be implemented as software modules, hardware modules, special-purpose hardware (e.g., application specific hardware, application specific integrated circuits (ASICs), digital signal processors (DSPs), etc.), embedded controllers, hardwired circuitry, etc.

Besides what is described herein, various modifications can be made to what is disclosed and implementations of the invention without departing from their scope. Therefore, the illustrations and examples herein should be construed in an illustrative, and not a restrictive sense. The scope of the invention should be measured solely by reference to the claims that follow.

What is claimed is:

1. An apparatus comprising:
   an on-die termination (ODT) circuit to apply one of multiple termination impedances; and
   an ODT enable signal line to receive an ODT enable signal as multiple serial bits received in sequence on the ODT enable signal line, the multiple serial bits to encode a selected termination impedance, the ODT enable signal triggered by a logic transition on the ODT enable signal line, followed by the multiple serial bits;
   wherein the ODT circuit is to apply the selected termination impedance in response to the ODT enable signal.

2. The apparatus of claim 1, wherein the multiple termination impedances include a write termination impedance.

3. The apparatus of claim 1, wherein the multiple termination impedances include a read termination impedance.

4. The apparatus of claim 1, wherein the multiple termination impedances include a default termination impedance.

5. The apparatus of claim 4, wherein the ODT circuit is to apply the selected termination impedance for a predetermined number of clock cycles, and then automatically switch to apply the default termination impedance.

6. The apparatus of claim 1, further comprising:
   a register to store configuration information, the register including a field to selectively enable decoding of the multiple serial bits of the ODT enable signal.

7. The apparatus of claim 6, wherein when the field is set to disable decoding of the multiple serial bits of the ODT enable signal, the ODT circuit is to interpret the ODT enable signal line as single-bit binary signal line.

8. The apparatus of claim 1, wherein the ODT circuit comprises an ODT circuit of a memory device.

9. A system comprising:
   a controller; and
   a memory device coupled to the controller, the memory device including
      an on-die termination (ODT) circuit to apply one of multiple termination impedances; and
      an ODT enable signal line to receive an ODT enable signal as multiple serial bits to encode a selected termination impedance, the ODT enable signal triggered by a logic transition on the ODT enable signal line, followed by the multiple serial bits;
      wherein the ODT circuit is to apply the selected termination impedance in response to the ODT enable signal.

10. The system of claim 9, wherein the multiple termination impedances include a write termination impedance, a read termination impedance, and a default termination impedance.

11. The system of claim 10, wherein the ODT circuit is to apply the selected termination impedance for a predetermined number of clock cycles, and then automatically switch to apply the default termination impedance.

12. The system of claim 9, the memory device further comprising:
    a register to store configuration information, the register including a field to selectively enable decoding of the multiple serial bits of the ODT enable signal.

13. The system of claim 12, wherein when the field is set to disable decoding of the multiple serial bits of the ODT enable signal, the ODT circuit is to interpret the ODT enable signal line as single-bit binary signal line.

14. The system of claim 9, further comprising one or more of:
    a host processor device coupled to the controller;
    a display communicatively coupled to a host processor;
    a network interface communicatively coupled to a host processor; or
    a battery to power the system.

15. An apparatus comprising:
    an ODT enable signal line to receive an ODT enable signal; and
    a register to store a value to indicate either a binary mode for the ODT enable signal line to apply ODT in response to a logic transition on the ODT enable signal line, or an encoding mode for the ODT enable signal line to apply an ODT value based on a sequence of bits received on the ODT enable signal line, wherein in the encoding mode, the ODT enable signal is triggered by a logic transition on the ODT enable signal line, followed by the sequence of bits.

16. The apparatus of claim 15, wherein the ODT value indicates one of separate ODT values for a write termination impedance, a read termination impedance, or a default termination impedance.

17. The apparatus of claim 15, wherein the register comprises a first register, and further comprising:
    a second register to store ODT values for the binary mode, wherein one of the ODT values stored in the second register is selected in response to the logic transition.

* * * * *